United States Patent
Fautz et al.

(10) Patent No.: US 7,528,601 B2
(45) Date of Patent: May 5, 2009

(54) THREE-DIMENSIONAL SLICE-SELECTIVE MULTI-SLICE EXCITATION METHOD IN MRT IMAGING

(75) Inventors: Hans-Peter Fautz, Pfaffenhofen (DE);
Stephan Kannengiesser, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 12/022,274

(22) Filed: Jan. 30, 2008

(65) Prior Publication Data
US 2008/0180099 A1 Jul. 31, 2008

(30) Foreign Application Priority Data
Jan. 30, 2007 (DE) .................. 10 2007 004 620

(51) Int. Cl.
G01V 3/00 (2006.01)
G06K 9/00 (2006.01)
G06K 9/40 (2006.01)

(52) U.S. Cl. .................. 324/307; 382/131; 382/268

(58) Field of Classification Search ......... 324/300–322; 600/410–435; 382/103, 128–134, 254–256, 382/260–269, 275, 286–292; 702/19–32
See application file for complete search history.

(56) References Cited

U.S. PATENT DOCUMENTS

| | | | |
|---|---|---|---|
| 5,109,854 A | 5/1992 | Provost | |
| 5,345,172 A | 9/1994 | Taguchi et al. | |
| 5,910,728 A * | 6/1999 | Sodickson | 324/309 |
| 6,600,317 B1 | 7/2003 | Kumai et al. | |
| 6,801,034 B2 | 10/2004 | Brittain et al. | |
| 6,801,035 B2 | 10/2004 | Wang | |
| 6,919,722 B2 * | 7/2005 | Angelos et al. | 324/309 |
| 7,312,610 B2 * | 12/2007 | Harder | 324/307 |
| 7,388,376 B2 * | 6/2008 | Heid et al. | 324/307 |
| 2003/0004410 A1 | 1/2003 | Zhu | |
| 2005/0017718 A1 | 1/2005 | Zwanenburg et al. | |

FOREIGN PATENT DOCUMENTS
WO WO2006/117922 A1 11/2006

\* cited by examiner

*Primary Examiner*—Dixomara Vargas
(74) *Attorney, Agent, or Firm*—Schiff Hardin LLP

(57) ABSTRACT

In a method and apparatus for MRT imaging, data sets acquired from magnetic resonance signals of at least two limited spatial regions of a subject to be examined, (the spatial regions being displaced relative to one another along one spatial direction and overlapping in the respective edge region. Phase coding occurs in an inhomogeneous non-edge region, likewise in this spatial direction. For at least one of these spatial regions, a modulation function is determined that is limited to this entire spatial region and modulates the subject information. Foldovers in the overlap regions of the different spatial regions are calculated on the basis of the modulation function and the MRT images of the non-edge regions of the respective spatial regions are combined without foldovers in the spatial direction under consideration of the calculated foldings.

9 Claims, 3 Drawing Sheets

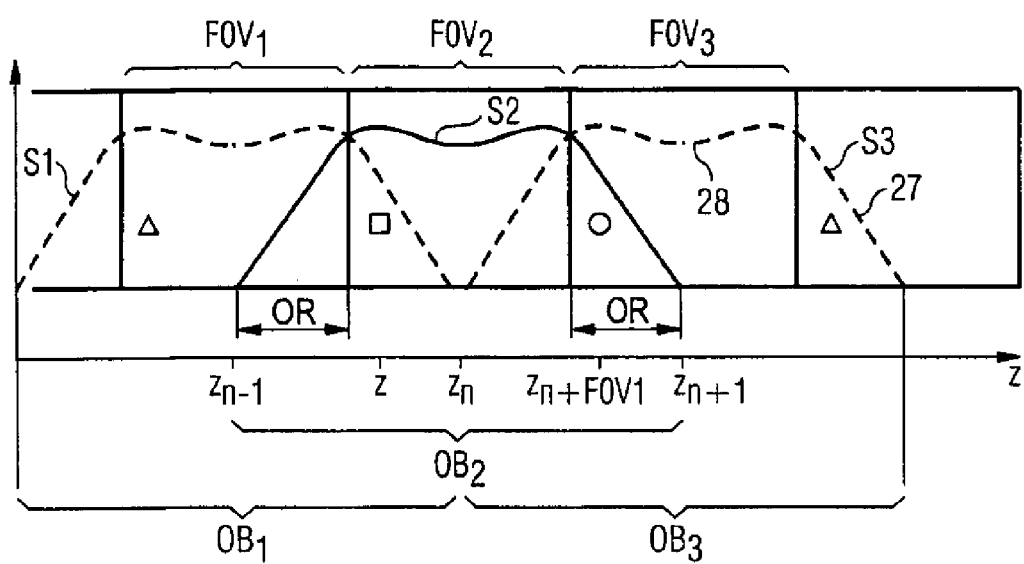

THREE-DIMENSIONAL SLICE-SELECTIVE MULTI-SLICE EXCITATION METHOD IN MRT IMAGING

BACKGROUND OF THE INVENTION

1. Field of the Invention

The present invention generally concerns nuclear magnetic resonance tomography (MRT) as used in medicine for examination of patients. The present invention concerns a method, as well as an MRT system for implementation of the method, that significantly increase the effectiveness of slice-selective multi-slice excitation in MRT imaging.

2. Description of the Prior Art

MRT is based on the physical phenomenon of nuclear magnetic resonance and has been successfully used for over 15 years as an imaging method in medicine and in biophysics. In this examination modality the subject is exposed to a strong, constant magnetic field. The nuclear spins of the atoms in the subject, which were previously randomly oriented, are thereby aligned.

Radio-frequency fields can now excite these "ordered" nuclear spins to a specific oscillation. In MRT, this oscillation generates the actual measurement signal which is acquired by means of suitable reception coils. By the use of inhomogeneous magnetic fields generated by gradient coils, the measurement subject can be spatially coded in all three spatial directions. The method allows a free selection of the slice to be imaged, whereby slice images of the human body can be acquired in all directions. MRT as a slice image method in medical diagnostics is distinguished predominantly as a "non-invasive" examination method with a versatile contrast possibility. Due to the excellent capability of representing soft tissue, MRT has developed into a method superior in many ways to x-ray computed tomography (CT). MRT today is based on the application of spin echo and gradient echo sequences that enable an excellent image quality with measurement times on the order of minutes.

To examine larger segments of a patient or, respectively, for whole-body acquisitions, a continuous table displacement (Move During Scan, MDS) or a step-by-step table displacement (in the z-direction, i.e. in the direction of the patient longitudinal axis) can advantageously be combined with a three-dimensional slice-selective multi-slice excitation. However, the quality of a slice-selective 3D imaging is strongly dependent on the profile of the respectively employed RF excitation pulse. This profile is not ideally rectangular (i.e. perpendicular edges defining an exactly horizontal amplitude therebetween) but rather normally exhibits more or less angled edges on both sides while the amplitude deviates from a linear course. Such a real profile is contrasted with an ideal profile in FIGS. 2a and 2b. The response or signal function (response function) of the system to such a non-ideal, non-rectangular excitation profile is likewise not ideal and appears as image inhomogeneities in the slice coding direction (z-direction).

According to the prior art, one possibility to prevent such image artifacts in the z-direction is to demarcate the FOV of the respective excitation block (slab) exclusively from the most substantially horizontal region of the respective non-ideal RF excitation pulse. A problem resulting therefrom is a fold-over of signal portions into the FOV (in the excitation block) given non-sampling of the RF pulse edges; namely signal portions that are generated by non-sampling of the edges of the non-ideal RF pulse that are situated outside of the FOV.

In particular given a step-by-step scanning in the z-direction in which the image data sets acquired block-by-block are likewise added to one another in the z-direction, this problem leads to a permeation of the entire region to be imaged with foldovers, which ultimately leads to an extremely poor image quality.

According to the prior art this problem is addressed by causing, in spite of the limitation of the FOV or FOVs horizontal width, the spatial coding (i.e. the k-space scanning) to occur along the entire RF pulse width of every RF excitation pulse, meaning that all edges are taken into account or will be in the coding and ultimately in the later image reconstruction. What is known as an oversampling of the edge regions thus ensues, which ultimately leads to a corresponding measurement time extension of an undesirable duration In order to keep the duration of the examination (data acquisition) within largely acceptable limits, the sharpness of the RF excitation pulse (the slab profile) must be optimized (meaning that its edges are made steeper), which in turn requires an increase of the RF pulse excitation energy and (to the disadvantage of the patient) increases the energy exposure (the specific absorption rate, SAR) in the tissue to be examined to values that are in many cases unacceptable.

As the preceding discussion shows, in MRT, according to the present prior art, the above-described problem is addressed by a compromise solution. A loss of the scan efficiency by oversampling is accepted, but only to a certain degree by the extent of the slab profile being limited, only as long as operation within the SAR limits can be achieved.

SUMMARY OF THE INVENTION

An object of the present invention is to provide a method as well as a system for implementation of the method that enable three-dimensional, slice-selective multi-slice excitation in MRT imaging to be improved.

According to the invention, in a method for MRT imaging, data sets are acquired from magnetic resonance signals of at least two limited spatial regions of a subject to be examined (which spatial regions are displaced relative to one another along one spatial direction and overlap in respective edge regions) with phase coding in an inhomogeneous non-edge region likewise in this spatial direction. For at least one of these spatial regions, a modulation function limited to this entire spatial region and modulating the subject information is determined. In accordance with the inventive method, foldovers in the overlap regions of the different spatial regions are calculated on the basis of the modulation function and the MRT images of the non-edge regions of the respective spatial regions are combined without foldovers in the spatial direction under consideration of the calculated foldings.

The determination of the modulation function of a spatial region advantageously ensues by determination of the flip angle distribution of the spatially-selective RF excitation pulse in the corresponding spatial region and/or by determination of the sensitivity profile of the local transmission coils in the corresponding spatial region.

Furthermore, the foldover-free combination advantageously ensues by calculation of folding-reduced target values, wherein the calculation ensues via linear combination of the measured folding-affected values ($J_n(z)$) with the values ($S(z)$) of at least one modulation function (Sn).

The acquisition of a data set inventively, respectively ensues after a step-by-step displacement of the subject in the spatial direction in an optimal embodiment of the invention or, in a further possible embodiment, during a continuous displacement of the subject in the spatial direction.

It is also advantageous when, according to the invention, the knowledge of redundant subject information in the overlap regions is taken into account in the calculation of the foldovers.

The above object also is achieved in accordance with the present invention by a magnetic resonance tomography system operating in accordance with the above-described method.

The above object also is achieved in accordance with the present invention by a computer-readable medium encoded with programming instructions (data structure) that, when the medium is loaded into a control computer of a magnetic resonance tomography system, cause the tomography system to operate in accordance with the method described above.

BRIEF DESCRIPTION OF THE DRAWINGS

FIG. 3 shows a triple multi-slice excitation in the z-direction with overlapping non-ideal slab profiles of each slice.

DESCRIPTION OF THE PREFERRED EMBODIMENTS

Figure 1:
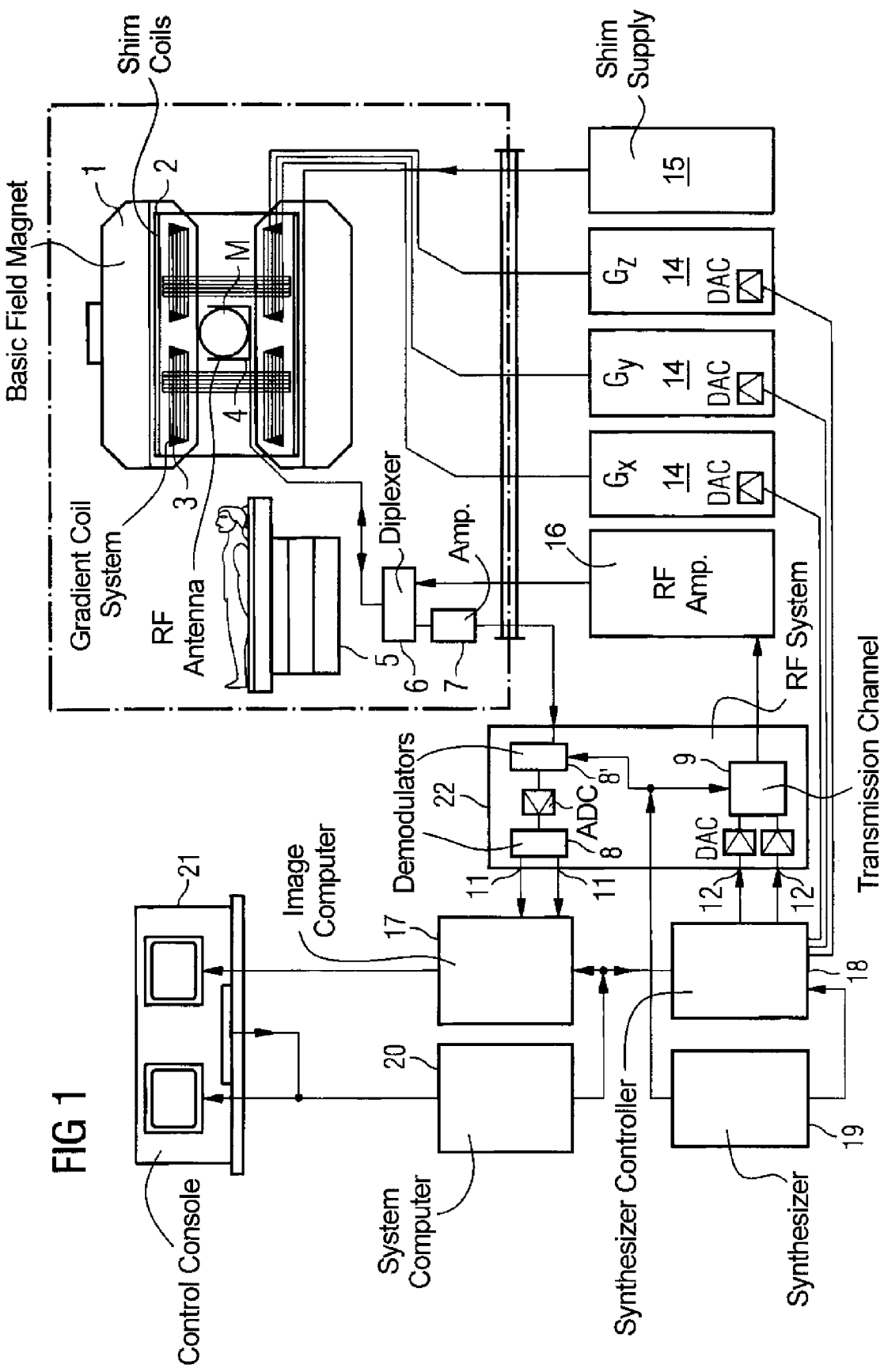
FIG. 1 schematically illustrates an inventive MRT apparatus for implementation of the inventive method.

FIG. 1 is a schematic representation of a magnetic resonance imaging apparatus for generation of a nuclear magnetic resonance image of a subject according to the present invention. The design of the magnetic resonance tomography apparatus corresponds to the design of a conventional tomography apparatus, with the differences noted below. A basic field magnet 1 generates a temporally-constant strong magnetic field for polarization or alignment of the nuclear spins in the examination region of a subject such as, for example, of a part of a human body to be examined. The high homogeneity of the basic magnetic field necessary for the magnetic resonance measurement (data acquisition) is defined in a spherical measurement volume M into which the parts of the human body to be examined are introduced. For this purpose, the patient lies on a mobile patient bed (movable table) that is introduced into the basic field magnet in order to place the region of the patient to be examined into the homogeneity volume. To support the homogeneity requirements, and in particular to eliminate temporally invariable influences, what are known as shim plates made from ferromagnetic material are mounted at a suitable location. Temporally variable influences are eliminated by shim coils 2 that are activated by a shim power supply 15.

A cylindrical gradient coil system 3 that has a number of windings (known as sub-windings) is used in the basic field magnet 1. Each sub-winding is supplied with current from an amplifier 14 for generation of a linear gradient field in the respective direction of the Cartesian coordinate system. The first sub-winding of the gradient field system 3 thereby generates a gradient $G_x$ in the x-direction, the second sub-winding generates a gradient $G_y$ in the y-direction and the third sub-winding generates a gradient $G_z$ in the z-direction. Each amplifier 14 includes a digital-analog converter that is activated by a sequence controller 18 for accurately timed generation of gradient pulses.

Located within the gradient field system 3 is a radio-frequency antenna 4 that converts the radio-frequency pulses emitted by a radio-frequency power amplifier into an alternating magnetic field for excitation of the nuclei and alignment of the nuclear spins of the subject to be examined or of the region of the subject to be examined. The radio-frequency antenna 4 includes one or more RF transmission coils and a number of RF acquisition coils in the form of the advantageously linear arrangement of component coils already described. The alternating field originating from the precessing nuclear spins (i.e. normally the nuclear spin echo signals caused by a pulse sequence composed of one or more radio-frequency pulses and one or more gradient pulses) is also converted by the RF acquisition coils of the radio-frequency antenna 4 into a voltage that is supplied via an amplifier 7 to a radio-frequency acquisition channel 8 of a radio-frequency system 22. The radio-frequency system 22 furthermore has a transmission channel 9 in which are generated the radio-frequency pulses for the excitation of the nuclear magnetic resonance. The respective radio-frequency pulses are thereby digitally represented in the sequence controller 18 as a series of complex numbers based on a pulse sequence predetermined by the system computer 20. This number series is respectively supplied as a real part and an imaginary part via an input 12 to a digital-analog converter in the radio-frequency system 22 and from this to a transmission channel 9. In the transmission channel 9 the pulse sequences are modulated on a radio-frequency carrier signal whose basic frequency corresponds to the resonance frequency of the nuclear spins in the measurement volume. This signal is amplified in RF amplifier 16.

The switch-over from transmission mode to acquisition mode ensues via a transmission-reception diplexer 6. The RF transmission coil of the radio-frequency antenna 4 radiates the radio-frequency pulses for excitation of the nuclear spins into the measurement volume M and samples resulting echo signals via the RF acquisition coils. The correspondingly-acquired nuclear magnetic resonance signals are phase-sensitively demodulated on then intermediate frequency in the acquisition channel 8' (first demodulator) of the radio-frequency system 22 and digitized in an analog-digital converter (ADC). This signal must be demodulated to the frequency 0. The demodulation to frequency 0 separation into real part and imaginary part occurs in the digital domain in a second demodulator 8 after the digitization. An image is reconstructed by an image computer 17 from the measurement data so acquired. The administration of the measurement data, the image data and the control programs ensues via the system computer 20. Based on a requirement with control programs, the sequence controller 18 monitors the generation of the respective desired pulse sequences and the corresponding sampling of k-space. The sequence controller 18 thereby in particular controls the time-accurate switching of the gradients, the emission of the radio-frequency pulses with defined phase and amplitude and the acquisition of the nuclear magnetic resonance signals. The time base for the radio-frequency system 22 and the sequence controller 18 is provided by a synthesizer 19. The selection of corresponding control programs for generation of a nuclear magnetic resonance image as well as the presentation of the generated magnetic resonance image ensues via a console 21 that has a keyboard as well as one or more screens.

It is the goal of the present invention to distinctly increase the effectiveness of slice-selective or, respectively, spatially-selective multi-slice excitations in MRT imaging.

Figure 2A:
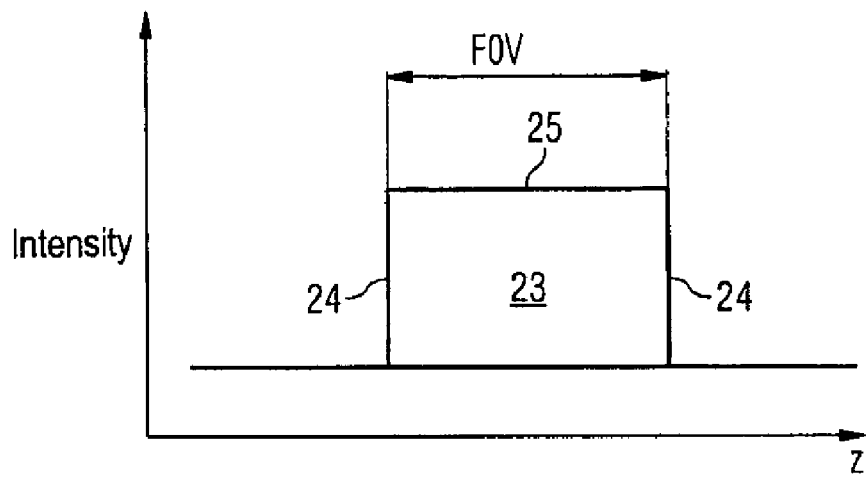
FIG. 2a schematically shows an ideal slab profile (a rectangular modulation function).
Figure 2B:
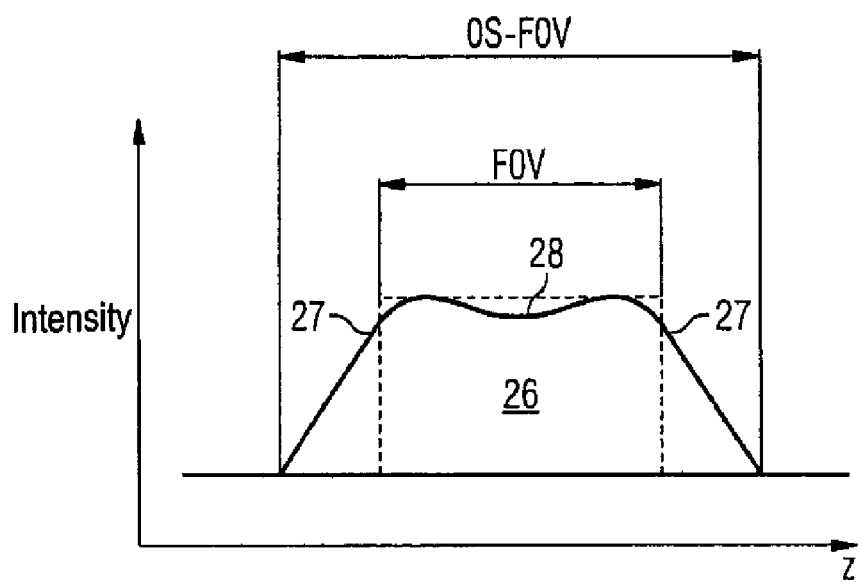
FIG. 2b schematically shows a real slab profile (a modulation function with angled edges and impression or, respectively, non-linear curve in the plateau).

Slice-selective or spatially-selective 3D imaging in MRT is severely impaired via non-ideal excitation profiles. An ideal RF excitation profile (according to the depiction in FIG. 2a) is characterized by an exactly horizontal plateau 25 which is bounded by exactly vertical edges 24. By contrast, a non-ideal (thus a real) excitation profile 26 (according to the depiction in FIG. 2b) exhibits angled edges 27 whose steepness is essentially limited by the specific absorption rate (SAR). The plateau 28 has a central non-linearity that causes no artifacts but disruptive intensity fluctuations in the later reconstructed image.

In order to be able to measure larger patient segments, in particular given short measurement volumes M (limited by magnet bores growing ever shorter (Engl.: decreasing bore lengths)) segment-by-segment (block-by-block) scanning is necessary that ensues during either a continuous or a likewise per-segment table displacement. The per-segment scanning ensues such that at least two spatial regions displaced counter to one another along a spatial direction (table displacement direction, i.e. in the direction of the patient longitudinal axis) and respectively inherently bound are excited and measured. The contrary displacement advantageously ensues (as can be seen from FIG. 3) such that a best possible excitation of the respective plateau FOVs 28 of the RF excitation profiles S of the respective spatial regions OB is given since only the plateau width actually corresponds to the FOV of interest. However, this causes an overlapping of the respective edge regions 27 of the one slab profile S2 with the corresponding edges of the adjoining plateau regions of the adjacent slab profiles S1, S3 which, given phase or spatial coding alone in the FOVs of interest (in the plateau regions), generates severe foldovers of the edges 27 in the border region of a FOV displaced by one FOV or a number of FOVs (which, in the case of very flat edges, as such sweep over a number of FOVs). Ultimately, such foldovers lead to extremely disruptive image inhomogeneities in the aforesaid spatial direction, and in fact in all combined plateau segments, i.e. thus over the entire FOV (composed from all partial FOV segments) of the entire plateau region of interest.

The procedure according to the prior art in order to reduce or to eliminate the foldovers (and therewith these image inhomogeneities) was presented in detail in the specification preamble.

By contrast, the present invention now exists in replacing the oversampling of all RF excitation profiles S necessary for artifact elimination with setting up and solving an algebraic equation system that reflect or describes the imaging problem. The mathematical solution of this equation system leads to a set of folding-free target values that can ultimately map to the desired FOV combination free of folding.

The algebraic equation system represents a linear equation system and can be written as $$J_n(z) = I(z) \cdot S(z - z_n) + \sum_{m \neq 0} I(z + m \cdot FOV) \cdot S(z - z_n + m \cdot FOV)$$

The following definitions apply:

z is the coordinate in the spatial coding direction, table displacement direction as well as phase coding direction, S(z) is the slice profile (modulating the target values) of the RF excitation pulse (also designated as a slab profile or modulation function), I(z) represents the intensity of the foldover-free target values, i.e. the desired artifact-free image, across all partial FOVs.

$J_n(z)$ is the measured intensity value belonging to the block n or to the slice n, inclusive of the foldings due to overlapping of adjacent FOV measurement values; however, $J_n(z)$ extends only over a range of $$z_n \pm \frac{FOV}{2}.$$

The overlapping itself is taken into account in the sum over $$m(\sum_m),$$

wherein m-values $\geq 2$ are only reasonable for slab profiles whose overlapping extends over more than two adjacent FOVs due to very flat edges.

The equation system is to be interpreted according to the following:

$J_n(z)$ are the actual measurement values that comprise the nuclear magnetic resonance signals of the respective FOV profile $$\left(z_n \pm \frac{FOV}{2}\right)$$

which, however, are modulated with the RF slice profile (slab profile S(z)). Due to the deviation from a precise rectangular profile 23, the slab profile experiences an expansion beyond the actual central FOV and modulates (influences) further slices n, which is accounted for by the further sum terms $$(\sum_m).$$

Due to its modulating character, the RF slice profile or slab profile is generally designated in the following as a "modulation function". As long as the number of measurement values corresponds to at least the number of the folding-free target values I(z) that are unknown (and therefore to be determined), as long as the equation system it solvable, the modulation function S(z) is assumed to be known.

How the modulation function S(z) is determined need not be described herein. It is noted, however, that such a modulation function does not exclusively have to be given by the slice profile (the flip angle distribution) of a spatially-selective RF excitation pulse; rather, by all means other modulating units of other technical provenance can also be superimposed. Such units can be, for example, sensitivity profiles of participating local transmission and/or acquisition coils (possibly arranged in a coil array) in the corresponding spatial region OB, as they are also used in conventional PPA imaging methods for measurement time reduction via reduction of time-consuming phase coding steps.

In order to determine the slice profile units of a modulation function S, for example, it would be possible to oversample a single RF slice profile. Since the RF slice profiles (slab profiles) of the different slices n differ only slightly, it is reasonable and efficient to use a slab profile determined once as a modulation function for all further slices. Furthermore, it is noted that it can be advantageous in the calculation of the foldings to take into account the knowledge of redundant subject information in the overlap regions OR. In principle, the RF slice profile can also be analytically determined via the employed RF pulse shape. Furthermore, it is conceivable that, via the use of information from a plurality of RF acquisition channels, a simultaneous estimation of I(z) and S(z) is possible using methods analogous to parallel imaging.

We claim:

1. A magnetic resonance tomography imaging method comprising the steps of:
    acquiring respective data sets from magnetic resonance signals of at least two limited spatial regions of a subject, the spatial regions being shifted relative to each other along one spatial direction and respectively having edge regions that overlap each other with phase coding in a non-homogenous non-edge region along said spatial direction;
    for at least one of said spatial regions, automatically electronically determining a modulation function, limited to an entirety of said at least one of said spatial regions, that modulates the magnetic resonance signals from said at least one of said spatial regions;
    automatically electronically calculating foldovers in a region of overlapping of said spatial regions dependent on said modulation function;
    combining magnetic resonance tomography images of the respective non-edge regions of the spatial regions without foldovers in said spatial direction, using the calculated foldovers in the overlapping region to produce a substantially foldover-free image data set; and
    making said substantially foldover-free image data set available in a form suitable for reconstructing a substantially foldover-free image of the subject therefrom.

2. A method as claimed in claim 1 comprising automatically electronically determining said modulation function in the respective spatial regions by, for each of said spatial regions, determining a flip angle distribution therein of a spatially-selective RF excitation pulse radiated therein.

3. A method as claimed in claim 1 comprising automatically electronically determining the modulation function of the respective spatial regions by determining, for each of said spatial regions, determining a sensitivity profile of local transmission coils used to excite nuclear spins therein.

4. A method as claimed in claim 1 comprising combining said magnetic resonance tomography images of the non-edge regions by calculating foldover-reduced target values with a linear combination of measured foldover-affected values with values of at least one of said modulation functions.

5. A method as claimed in claim 1 comprising acquiring the respective data sets after a step-by-step displacement of the subject in said spatial direction.

6. A method as claimed in claim 1 comprising acquiring the respective data sets during a continuous displacement of the subject in said spatial direction.

7. A method as claimed in claim 1 comprising calculating said foldovers using redundant subject information in the overlapping region.

8. A magnetic resonance tomography system comprising:
    a controller that operates said data acquisition unit to acquire respective data sets from said magnetic resonance signals of at least two limited spatial regions of the subject, the spatial regions being shifted relative to each other along one spatial direction and respectively having edge regions that overlap each other with phase coding in a non-homogenous non-edge region along said spatial direction;
    a computer supplied with said data sets that, for at least one of said spatial regions, automatically determines a modulation function, limited to an entirety of said at least one of said spatial regions, that modulates the magnetic resonance signals from said at least one of said spatial regions, and that automatically calculates foldovers in a region of overlapping of said spatial regions dependent on said modulation function, and that combines magnetic resonance tomography images of the respective non-edge regions of the spatial regions without foldovers in said spatial direction, using the calculated foldovers in the overlapping region to produce a substantially foldover-free image data set, and that reconstructs a substantially foldover-free image of the subject from said substantially foldover-free image data set.

9. A computer-readable medium encoded with programming instructions, said medium being loadable into a control computer of a magnetic resonance tomography apparatus and causing said magnetic resonance tomography apparatus to:
    acquire respective data sets from magnetic resonance signals of at least two limited spatial regions of a subject, the spatial regions being shifted relative to each other along one spatial direction and respectively having edge regions that overlap each other with phase coding in a non-homogenous non-edge region along said spatial direction;
    for at least one of said spatial regions, automatically electronically determine a modulation function, limited to an entirety of said at least one of said spatial regions, that modulates the magnetic resonance signals from said at least one of said spatial regions;
    automatically electronically calculate foldovers in a region of overlapping of said spatial regions dependent on said modulation function;
    combine magnetic resonance tomography images of the respective non-edge regions of the spatial regions without foldovers in said spatial direction, using the calculated foldovers in the overlapping region to produce a substantially foldover-free image data set; and
    a substantially foldover-free image of the subject from said substantially foldover-free image data set.

* * * * *